(12) United States Patent
Hayashi et al.

(10) Patent No.: US 7,855,036 B2
(45) Date of Patent: Dec. 21, 2010

(54) SPUTTERING TARGET USED FOR PRODUCTION OF REFLECTIVE MASK BLANK FOR EUV LITHOGRAPHY

(75) Inventors: Kazuyuki Hayashi, Chiyoda-ku (JP); Takashi Sugiyama, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 164 days.

(21) Appl. No.: 12/353,284

(22) Filed: Jan. 14, 2009

(65) Prior Publication Data

US 2009/0130574 A1    May 21, 2009

Related U.S. Application Data

(63) Continuation of application No. PCT/JP2007/070218, filed on Oct. 10, 2007.

(30) Foreign Application Priority Data

Oct. 19, 2006    (JP) .............................. 2006-284720

(51) Int. Cl.
G03F 1/00    (2006.01)
C23C 14/24    (2006.01)
(52) U.S. Cl. ...................................... 430/5; 204/298.13
(58) Field of Classification Search ...................... 430/5; 204/298.13, 298.14
See application file for complete search history.

(56) References Cited

U.S. PATENT DOCUMENTS

| 6,699,625 | B2 | 3/2004 | Lee et al. |
| 2002/0106297 | A1 | 8/2002 | Ueno et al. |
| 2006/0237303 | A1 | 10/2006 | Hosoya et al. |

FOREIGN PATENT DOCUMENTS

| EP | 1 607 940 A2 | 12/2005 |
| EP | 2006283053 | 10/2006 |
| EP | 2006283054 | 10/2006 |
| JP | 2002122981 | 4/2002 |
| JP | 2005-268750 | 9/2005 |
| WO | WO 2007/142365 A1 | 12/2007 |

OTHER PUBLICATIONS

U.S. Appl. No. 12/578,648, filed Oct. 14, 2009, Hayashi, et al.

*Primary Examiner*—Stephen Rosasco
(74) *Attorney, Agent, or Firm*—Oblon, Spivak, McClelland, Maier & Neustadt, L.L.P.

(57) ABSTRACT

To provide a sputtering target to be used for production of an EUV mask blank, capable of preventing particles by film peeling even when formation of a reflective multilayer film as a reflective layer and a Ru layer as a protective layer is carried out at a production level using actual machines for a large number of cycles. A sputtering target for forming a ruthenium (Ru) layer in a reflective layer for reflecting EUV light on a substrate, which contains Ru and at least one element selected from the group consisting of boron (B) and zirconium (Zr) in a total content of B and Zr of from 5 at % to 50 at %.

9 Claims, No Drawings

SPUTTERING TARGET USED FOR PRODUCTION OF REFLECTIVE MASK BLANK FOR EUV LITHOGRAPHY

TECHNICAL FIELD

The present invention relates to a sputtering target to be used for production of a reflective mask blank for EUV (Extreme Ultraviolet) lithography (hereinafter, referred to as "EUV mask blank" in the present specification) to be used for semiconductor manufacturing or the like.

The present invention further relates to an EUV mask blank produced by using the sputtering target, and its production process.

The present invention further relates to a substrate with a functional film for an EUV mask blank produced by using the sputtering target, and its production process.

BACKGROUND ART

In the semiconductor industry, a photolithography method using visible light or ultraviolet light has been employed as a technique for writing, on a silicon substrate or the like, a fine pattern, which is required for writing an integrated circuit comprising such a fine pattern. However, the conventional exposure techniques using light exposure have been close to the limit of the conventional photolithography method while semiconductor devices have had finer patterns at an accelerated pace. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, has been considered as being promising as the exposure technique for 45 nm or below. In the present specification, it should be noted that the phrase "EUV light" means a ray having a wavelength in a soft X ray region or a vacuum ultraviolet ray region, specifically a ray having a wavelength of about from 10 to 20 nm, in particular, of about 13.5 nm±0.3 nm.

It is impossible to use EUV light in conventional dioptric systems as in photolithography using visible light or ultraviolet light since EUV light is apt to be absorbed by any substances and since the refractive index of the substances is close to 1 at the above wavelength. For this reason, a catoptric system, i.e., a combination of a reflective photomask and a mirror, is employed in EUV light lithography.

A mask blank is a stacked member to be used for fabrication of a photomask, which has not been patterned yet. In the case of an EUV mask blank, it has a structure wherein a substrate made of glass or the like has a reflective layer for reflecting EUV light and an absorber layer for absorbing EUV light, formed thereon in this order. The reflective layer normally comprises a reflective multilayer film, which comprises molybdenum (Mo) layers as high refractive index layers and silicon (Si) layers as low refractive index layers alternately stacked by means of a sputtering method to increase a light reflectance when irradiating a layer surface with EUV light.

The absorber layer comprises a material having a high absorption coefficient to EUV light, specifically, is for example, a material containing chromium (Cr) or tantalum (Ta) as the main component.

Between the reflective layer and the absorber layer, usually a protective layer is formed to prevent the surface of the reflective layer from being oxidized. As a material of the protective layer, silicon (Si) has been widely used. Patent Document 1 proposed use of ruthenium (Ru) as the material of the protective layer.

In a case where Ru is used as the material of the protective layer, a high etching selectivity of the absorber layer will be obtained and further, a high reflectance will be obtained as compared with a case where a Si film is used as the protective layer.

Further, Patent Document 2 proposes a protective layer made of a ruthenium compound (Ru content of from 10 to 95 at %) containing Ru and at least one member selected from Mo, Nb, Zr, Y, B, Ti and La.

Such a protective layer is formed usually by a sputtering method.

In production of an EUV mask blank, in order to prevent an increase in defects on the surface of the reflective layer and oxidation on the surface of the reflective layer, formation of the reflective layer and formation of the protective layer are conducted usually in the same deposition chamber.

Patent Document 1: JP-A-2002-122981
Patent Document 2: JP-A-2005-268750

DISCLOSURE OF THE INVENTION

Objects to be Accomplished by the Invention

However, it was found that when formation of a reflective multilayer film as a reflective layer and formation of a Ru layer as a protective layer are carried out continuously at a production level using actual machines, particles are attached to the surface of the reflective multilayer film and the surface of the protective layer after about 100 cycles or more, thus leading to deposition defects. If a reflective mask for EUV exposure for which high printing precision for fine patterns of several tens nm is required is produced using a substrate with such a reflective multilayer film and a protective layer having particles attached to their surface, and patterning on a desired substrate by EUV is carried out using such a mask, the particles will cause pattern defects, and such will adversely affect the pattern printing precision, and the yield of a semiconductor will be lowered.

The particles problematic here are particles formed in such a manner that in formation of a reflective multilayer film as a reflective layer and in formation of a Ru layer as a protective layer, some of sputtered atoms are attached to the inner wall of a deposition chamber and structures in the chamber, for example, peripheral components such as a substrate-holding unit, a target-holding unit, a target-shielding plate and an ion gun, to form a deposited film, which is peeled off by some reasons to form particles. Hereinafter in the present invention, such particles will be referred to as "particles by film peeling".

After maintenance of a sputtering apparatus is done, pre-sputtering is conducted for a relatively long time (e.g. about 60 minutes) in a state where no substrate is disposed so as to remove organic substances on the surface of the sputtering target and a native oxide film. During pre-sputtering of an Ru target, a relatively thick Ru deposited film forms, and such is considered to be influential in formation of particles by film peeling.

In order to overcome problems in conventional technique, the object of the present invention is to provide a sputtering target to be used for production of an EUV mask blank, capable of preventing particles by film peeling even when formation of a reflective multilayer film as a reflective layer and a Ru layer as a protective layer is carried out at a production level using actual machines for a large number of cycles.

Another object of the present invention is to provide an EUV mask blank produced by using the above sputtering target and its production process.

Further, still another object of the present invention is to provide a substrate with a reflective layer for EUV lithography (hereinafter referred to as a "substrate provided with an EUV reflective layer" produced by using the above sputtering target and its production process.

Means to Accomplish the Objects

To achieve the above objects, the present inventors have conducted extensive studies on the particles by film peeling and as a result, found the following. That is, the stress differs depending on components constituting a deposited film attached to the inner wall of a deposition chamber and structures in the chamber, more specifically, a stress of film components attached at the time of deposition of a Ru layer as a protective layer, i.e. a Ru film, is remarkably high as compared with film components attached at the time of deposition of a reflective multilayer film as a reflective layer, i.e. a Si film and a Mo film, and such difference in the stress causes particles by film peeling.

The present inventors have conducted extensive studies based on the above discoveries and as a result, found that the stress of a film attached at the time of deposition of a Ru layer can be lowered, whereby particles by film peeling can be suppressed, by incorporating a specific element to a sputtering target to be used for formation of a Ru layer as a protective layer in a specific content, without impairing properties required for a Ru layer such as EUV light reflectance and is etching resistance.

The present invention has been accomplished on the basis of the above discoveries and provides a sputtering target for forming a ruthenium (Ru) layer in a reflective layer for reflecting EUV light on a substrate, which contains Ru and at least one element selected from the group consisting of boron (B) and zirconium (Zr) in a total content of B and Zr of from 5 at % to 50 at %.

The present invention further provides a process for producing a substrate with a reflective layer for EUV lithography, which comprises a step of forming a ruthenium (Ru) layer in a reflective layer for reflecting EUV light on a substrate, by sputtering using the above sputtering target.

The present invention further provides a process for producing a substrate with a reflective layer for EUV lithography, which comprises a step of forming, on a reflective layer for reflecting EUV light, a ruthenium (Ru) layer as a protective layer for the reflective layer, by sputtering using the above sputtering target.

The present invention further provides a substrate with a reflective layer for EUV lithography, produced by the above process.

The present invention further provides a process for producing a reflective mask blank for EUV lithography, which comprises a step of forming a ruthenium (Ru) layer in a reflective layer for reflecting EUV light on a substrate, by sputtering using the above sputtering target.

The present invention further provides a process for producing a reflective mask blank for EUV lithography, which comprises a step of forming, on a reflective layer for reflecting EUV light, a ruthenium (Ru) layer as a protective layer for the reflective layer, by sputtering using the above sputtering target.

The present invention still further provides a reflective mask blank for EUV lithography, produced by the above process.

EFFECTS OF THE INVENTION

According to the present invention, even when formation of a reflective multilayer film as a reflective layer and a Ru layer as a protective layer is carried out at a production level using actual machines for a large number of cycles, specifically for 100 cycles or more, particles by film peeling can be prevented. Thus, an EUV mask blank, with a small amount of particles attached to the surface of the reflective multilayer film and the surface of the protective layer, can be obtained.

Further, it is possible to increase the number of cycles for forming a reflective multilayer film as a reflective layer and a Ru layer as a protective layer, thus improving productivity.

BEST MODE FOR CARRYING OUT THE INVENTION

Now, the present invention will be described in detail.

The sputtering target of the present invention is a sputtering target for forming a ruthenium (Ru) layer (including both Ru layer as a part of a reflective multilayer film and a Ru layer as a protective layer for a reflective layer) in a reflective layer for reflecting EUV light on a substrate, which contains Ru and at least one element selected from the group consisting of boron (B) and zirconium (Zr) in a total content of B and Zr of from 5 at % to 50 at %.

The following three embodiments are conceivable as the sputtering target of the present invention.

Sputtering target (A): containing Ru and B in a B content of from 5 at % to 50 at %.

Sputtering target (B): containing Ru and Zr in a Zr content of from 5 at % to 50 at %.

Sputtering target (C): containing Ru, B and Zr in a content of B and Zr of from 5 at % to 50 at %.

In the sputtering target (C), the B and Zr contents are preferably such that B: 2.5 to 20 at % and Zr: 2.5 to 30 at %.

The Ru layer in the reflective layer for reflecting EUV light includes, in addition to a Ru layer as a protective layer for the reflective layer, a Ru layer as a part of the reflective multilayer film as a reflective layer i.e. a Ru layer incorporated as a high refractive index layer in the reflective multilayer film.

In the present invention, the Ru layer is one containing, in addition to Ru, at least one element selected from the group consisting of B and Zr in an amount described hereinafter.

When a Ru layer is formed by sputtering using the sputtering target of the present invention, a Ru layer to be obtained contains, in addition to Ru, B and/or Zr in a total content of from 2.5 to 30 at %.

When a Ru layer is formed by using the above sputtering target (A), a Ru layer to be obtained contains B in a content of from 2.5 to 30 at % in addition to Ru.

When a Ru layer is formed by using the above sputtering target (B), a Ru layer to be obtained contains Zr in a content of from 2.5 to 30 at % in addition to Ru.

When a Ru layer is formed by using the above sputtering target (C), a Ru layer to be obtained contains B and Zr in a total content of from 2.5 to 30 at % in addition to Ru.

In the Ru layer to be formed by using the sputtering target (C), the B and Zr contents are preferably such that B:1.3 to 10 at % and Zr:1.3 to 15 at %.

When a Ru layer is formed by using the sputtering target of the present invention, a Ru layer to be obtained is amorphous.

In the present specification, the "Ru layer is amorphous" means a Ru layer having a microcrystalline structure in addition to a Ru layer having an amorphous structure with no crystalline structure at all.

The Ru layer being amorphous i.e. having an amorphous structure or having a microcrystalline structure is confirmed by X-ray diffraction (XRD) method. No sharp peak will be observed on a diffraction peak obtainable by XRD measurement when a Ru layer has an amorphous structure or a microcrystalline structure.

A Ru layer containing B and Zr in a total content of from 2.5 to 30 at % has an amorphous structure, and accordingly a film stress (compressive stress) generated in the Ru layer remarkably decreases as compared with a Ru layer constituted only by Ru. For example, in Examples described hereinafter, the film stress (compressive stress) generated in a Ru layer containing B or Zr in a content of 26 at % is decreased to about $1/7$ as compared with a Ru layer constituted only by Ru.

The same decrease in the film stress as described above occurs also with respect to the film components to be attached to the inner wall of a deposition chamber and structures in the chamber at the time of forming a Ru layer. As a result, the difference in stress between film components attached at the time of deposition of a reflective multilayer film as a reflective layer and film components to be attached at the time of deposition of a Ru layer as a protective layer, is sufficiently small.

In Examples as described hereinafter, the film stress (compressive stress) of a Si/Mo reflective multilayer film as a whole is about 400 MPa, whereas the film stress (compressive stress) of a Ru film containing B or Zr in a content of 26 at % is about 320 MPa, and the difference in stress between them is very small as compared with a film stress (compressive stress) of a Ru layer constituted only by Ru of about 2,100 MPa. The same applies to the difference in film stress between film components to be attached at the time of deposition of a reflective multilayer film as a reflective layer and film components to be attached at the time of deposition of a Ru layer as a protective layer.

As described above, the cause of particles by film peeling is a dispersion of stress among components constituting a deposited film attached to the inner wall of a deposition chamber and structures in the chamber, and more specifically, a significantly high stress of film components to be attached at the time of deposition of a Ru layer as a protective layer as compared with film components to be attached at the time of deposition of a reflective multilayer film as a reflective layer.

Therefore, according to the present invention, the difference in film stress between film components to be attached at the time of deposition of a reflective multilayer film as a reflective layer and film components to be attached at the time of deposition of a Ru layer as a protective layer, is sufficiently small, whereby formation of particles by film peeling can be suppressed.

Each of B and Zr has an absorption coefficient to EUV light equal to or lower than that of Ru, and thus the EUV light reflectance will not be impaired by incorporation of B and Zr in a total content of from 2.5 to 30 at %. Further, the etching resistance will not be impaired by incorporation of B and Zr in the above content.

In the sputtering target of the present invention, the total content of B and Zr is from 5 at % to 50 at %. If the total content of B and Zr is less than 5 at %, the film stress of the film components to be attached to the inner wall of a deposition chamber and structures in the chamber at the time of formation of a Ru layer can not sufficiently be reduced, and accordingly formation of particles by film peeling can not be suppressed. If the total content of B and Zr exceeds 50 at %, a sputtering target can not be formed. The sputtering target of the present invention is prepared by a powder sintering method described hereinafter. That is, raw materials i.e. Ru, and B and Zr, are blended into a desired compositional ratio and pressure formed, and then sintered in the atmospheric atmosphere at high temperature (e.g. 1,200° C.) in an atmospheric pressure. If the total content of B and Zr among the raw materials exceeds 50 at %, a sintered product to be obtained has a low sintered density and is very fragile, and is likely to be cracked or chipped when formed into a sputtering target.

The shape and the dimensions of the sputtering target of the present invention are not particularly limited, and desired shape and dimensions are employed according to need.

For example, the shape of the sputtering target may be circular or rectangular. Further, the dimensions of the sputtering target may be from about 2 inches to 12 inches. However, the above description regarding the shape and the dimensions of the sputtering target is nearly one example and the shape and the dimensions of the sputtering target are not limited thereto.

In Examples in Patent Document 2, as a material of the protective film, a compound of Ru and B, and a compound of Ru and Zr are used (Examples 5 and 6 (ZrRu), Example 10 ($Ru_7B_3$), Examples 11 and 16 (RuB), Example 12 ($Ru_2B$) and Example 13 ($RuB_2$)). However, all these protective films are considered to be one formed by sputtering using a target having a B or Zr chip deposited on a Ru target or one formed by sputtering using two types of sputtering targets differing in the composition in combination, that is, one formed by sputtering using a Ru target and a B target in combination or one formed by sputtering using a Ru target and a Zr target in combination, not one formed by sputtering using a target containing Ru and B simultaneously in one sputtering target (i.e. the above sputtering target (A)) or a target containing Ru and Zr simultaneously (i.e. the above sputtering target (B)). The reason is a high content of B or Zr in the protective film of at least 30 at % in Examples of Patent Document 2 (Examples 5 and 6 (Zr: 50 at %), Example 10 (B: 30 at %), Examples 11 and 16 (B: 50 at %), Example 12 (B: 33 at %) and Example 13 (B: 66 at %)).

In a case where sputtering is carried out by using the above sputtering target (A), the B content in the protective film to be obtained is about half the B content in the sputtering target. In the same manner, when sputtering is carried out by using the above sputtering target (B), the Zr content in the protective film to be obtained is about half the Zr content in the sputtering target. Accordingly, the protective films in Examples 5 and 6 having a Zr content of 50 at % can not be formed by sputtering using the sputtering target (B). In the same manner, the protective films in Examples 11, 13 and 16 having a B content of at least 50 at % can not be formed by sputtering using the sputtering target (A). Further, the protective films in Examples 10 and 12 having a B content of at least 30 at % can not be formed by sputtering using the sputtering target (A). If the relation between the B content in the sputtering target (A) and the B content in the protective film to be obtained is applied to Examples 11, 13 and 16, in order that the film contains B in a content of 50 at % or higher, the B content in the sputtering target (A) is required to be 60 at % or 66 at %. However, as described above, if the B content exceeds 50 at %, the sintered product to be obtained has a low sintered density and is very fragile, and can hardly be formed into a sputtering target. Further, even if it can be formed into a target, the target will easily be cracked or chipped and as a result, film deposition by using such a target is difficult. That is, in an EUV mask blank, as described above, presence of very fine defects in the film is problematic in exposure. If a target which is likely to be cracked or chipped is used for film deposition, fine chips from the target formed at the time of deposition will be deposited on a substrate together with the film and as a result, defects will increase, and the product can not be used as an EUV mask blank at all.

As evident from the above, the protective film in Examples in Patent Document 2 is considered to be one formed by sputtering using a target having a B or Zr chip disposed on a Ru target, one formed by sputtering using a Ru target and a B target in combination, or one formed by sputtering using a Ru target and a Zr target in combination. In such a case, a film having a uniform composition is formed on a substrate, but at the periphery thereof, i.e. on a film attached to the inner wall of a deposition chamber or structures in the chamber, a region consisting of only crystalline Ru is present, thus increasing the film stress and leading to formation of particles by film peeling.

On the other hand, when a Ru layer is formed by using the sputtering target of the present invention, the Ru layer to be obtained is amorphous and accordingly, not only in the Ru layer formed on a substrate but also at the periphery i.e. in the film attached to the inner wall of a deposition chamber and structures in the chamber, the film stress (compressive stress) remarkably decreases. As a result, formation of particles by film peeling is suppressed.

Further, in Examples in Patent Document 2, the Ru content in the protective film is so low as at most 70 at %, whereby properties that a Ru layer originally has can not be exhibited.

In the sputtering target of the present invention, the total content of B and Zr is more preferably from 10 at % to 45 at %, furthermore preferably from 20 at % to 40 at %.

In the sputtering target of the present invention, the relative density determined in accordance with the following formula is preferably at least 60%:

Relative density (%)=(bulk density/true density)×100

The bulk density (g/cm$^3$) is a measured density determined from the dimensions and the weight of the prepared target, and the true density is a theoretical density determined by calculation from the theoretical density characteristic of a substance.

A relative density of the sputtering target of at least 60% provides sufficient mechanical strength for forming a target for sputtering. The relative density of the sputtering target is more preferably at least 80%.

In the sputtering target of the present invention, the resistance of the target is preferably at most $1.0 \times 10^{-1}$ Ω·cm. When the resistance of the target is at most $1.0 \times 10^{-1}$ Ω·cm, the surface resistance of the target is sufficiently low, and such a target is suitable as a sputtering target. The resistance of the sputtering target is more preferably at most $1.0 \times 10^{-2}$ Ω·cm.

Now, procedure for production of an EUV mask blank by the present invention will be described. However, the procedure is basically the same as conventional procedure for production of an EUV mask blank except that the above sputtering target of the present invention is used for formation of a Ru layer as a protective layer.

First, a reflective layer for reflecting EUV light is formed on a substrate.

The substrate is required to satisfy properties as a substrate for an EUV mask blank. Accordingly, the substrate is preferably one having a low coefficient of thermal expansion (preferably $0\pm1.0\times10^{-7}$/° C., more preferably $0\pm0.3\times10^{-7}$/° C., furthermore preferably $0\pm0.2\times10^{-7}$/° C., still more preferably $0\pm0.1\times10^{-7}$/° C., particularly preferably $0\pm0.05\times10^{-7}$/° C.) and being excellent in smoothness, flatness and resistance to a cleaning liquid to be used e.g. for a mask blank or a photomask after formation of a pattern. As the substrate, specifically, glass having a low coefficient of thermal expansion, such as a $SiO_2$—$TiO_2$ glass may be used, but the substrate is not limited thereto, and a substrate made of crystallized glass with a β quartz solid solution precipitated therein, quartz glass, silicon, metal or the like may also be used. The substrate preferably has a smooth surface of at most 0.15 nm rms and a flatness of at most 100 nm, with a view to obtaining a high reflectance and printing precision in a photomask after pattern formation. The dimensions, the thickness and the like of the substrate are properly determined according to the designed values of a mask or the like. In Examples described hereinafter, a $SiO_2$—$TiO_2$ glass having outer dimensions of 6 inch (152.4 mm) square and a thickness of 0.25 inch (6.3 mm) was used. It is preferred that no defects are present on the surface of the substrate on a side where the reflective layer is formed. However, even when defects are present, it is preferred that the depth of the concave defects and the height of the convex defects are at most 2 nm and that the half value width of the concave defects and the convex defects is at most 60 nm, in order that no phase defects are formed by the concave defects and/or the convex defects.

The reflective layer is not particularly limited so long as it has properties as desired as a reflective layer for an EUV mask blank. The property that is particularly required for the reflective layer is that it has a high EUV light reflectance. Specifically, when the reflective layer is irradiated with a ray in the wavelength range of the EUV light at an angle of incidence of 6°, the maximum reflectance to light having a wavelength in the vicinity of 13.5 nm is preferably at least 60%, more preferably at least 65%. Further, even after a Ru layer as a protective layer is formed on the reflective layer, the maximum reflectance to light having a wavelength in the vicinity of 13.5 nm is preferably at least 60%, more preferably at least 65%.

As the reflective layer, usually a reflective multilayer film having high refractive index layers and low refractive index layers alternately stacked several times is used, which achieves a high EUV light reflectance. A reflective multilayer film which satisfies the above properties may be a Si/Mo reflective multilayer film having Si films and Mo films alternately stacked, a Be/Mo reflective multilayer film having Be films and Mo films alternately stacked, a Si compound/Mo compound reflective multilayer film having Si compound films and Mo compound films alternately stacked, a Si/Mo/Ru reflective multilayer film having Si films, Mo films and Ru films alternately stacked in this order, or a Si/Ru/Mo/Ru reflective multilayer film having Si films, Ru film, Mo films and Ru films alternately stacked in this order.

The thicknesses and the number of repeating units of the layers constituting the reflective multilayer film as a reflective layer are properly selected depending upon the film material used and the EUV light reflectance required for the reflective layer. In the case of a Mo/Si reflective layer as an example, in order that the reflective layer has a maximum EUV light reflectance of at least 60%, Mo layers having a thickness of 2.3±0.1 nm and Si layers having a thickness of 4.5±0.1 nm are stacked with a number of repeating units of from 30 to 60 to form the reflective multilayer film.

The respective layers constituting the reflective multilayer film for the reflective layer may be formed to have desired thicknesses by a known film deposition method such as magnetron sputtering or ion beam sputtering. For example, in the case of forming a Si/Mo reflective multilayer film by ion beam sputtering, it is preferred to form a Si film so as to have a thickness of 4.5 nm, using a Si target as the target and an Ar gas (a gas pressure: $1.3 \times 10^{-2}$ Pa to $2.7 \times 10^{-2}$ Pa) as the sputtering gas with an ion acceleration voltage of from 300 to 1,500 V at a deposition rate of from 0.03 to 0.30 nm/sec, and then to form a Mo film so as to have a thickness of 2.3 nm, using a Mo target as the target and an Ar gas (gas pressure: $1.3 \times 10^{-2}$ Pa to $2.7 \times 10^{-2}$ Pa) as the sputtering gas with an ion acceleration voltage of from 300 to 1,500 V at a deposition rate of from 0.03 to 0.30 nm/sec. By stacking Si films and Mo films in 40 to 50 cycles, each of the cycles comprising the above steps, the Si/Mo reflective multilayer film is formed.

In the case of one including a Ru film among the above reflective multilayer films, in formation of the Ru film, the sputtering target of the present invention may by used.

Then, a protective layer is formed on the reflective layer.

The protective layer is formed for the purpose of protecting the reflective layer from being damaged by an etching process during pattern formation on the absorber layer by etching process, usually by plasma etching process, and for the purpose of preventing the surface of the reflective layer from being oxidized. It is preferred that the EUV light reflectance of the reflective layer is not impaired even after formation of the protective layer.

In the present invention, a Ru layer as a protective layer is formed on the reflective layer by sputtering using the above-described sputtering target of the present invention. The Ru layer further increases the EUV light reflectance and is suitable as a protective layer for the reflective layer of an EUV mask blank. A Ru layer formed by using the sputtering target of the present invention contains, in addition to Ru, at least one element selected from the group consisting of B and Zr in a total content of from 2.5 to 30 at %, but each of B and Zr has an absorption coefficient to EUV light equal to or lower than that of Ru, and accordingly the EUV light reflectance will not be impaired by incorporation of B and Zr in the above total content. Further, the etching resistance will not be impaired by incorporation of B and Zr in the above total content.

The Ru layer as a protective layer, which contains at least one element selected from the group consisting of B and Zr in a total content of from 2.5 to 30 at %, is excellent in surface smoothness. Specifically, the Ru layer as a protective layer has a surface roughness of at most 0.5 nm rms. When the surface roughness on the surface of the protective layer is great, the surface roughness of the absorber layer to be formed on the protective layer tends to be significant, and the edge roughness of a pattern to be formed on the absorber layer tends to be significant, thus deteriorating the dimensional accuracy of the pattern. Since the influence of the edge roughness tends to increase as the pattern becomes fine, the surface of the absorber layer is required to be smooth.

When the surface roughness on the surface of the protective layer is at most 0.5 nm rms, the surface of the absorber layer to be formed on the protective layer will be sufficiently smooth, and accordingly, the dimensional accuracy of the pattern will not be deteriorated by the influence of the edge roughness. The surface roughness on the surface of the protective layer is more preferably at most 0.4 nm rms, more preferably at most 0.3 nm rms.

The thickness of the protective layer is preferably from 1 to 10 nm with a view to increasing the EUV light reflectance and obtaining etching resistance. The thickness of the protective layer is more preferably from 1 to 5 nm, furthermore preferably from 2 to 4 nm.

The sputtering for forming a protective layer is not particularly limited so long as the sputtering target of the present invention is used, and it may be either magnetron sputtering or ion beam sputtering.

In a case where the protective layer is formed by magnetron sputtering, specifically, magnetron sputtering is carried out under the following conditions.

Sputtering gas: Ar (gas pressure: $1.0 \times 10^{-1}$ to $10 \times 10^{-1}$ Pa, preferably $1.0 \times 10^{-1}$ to $5.0 \times 10^{-1}$ Pa, more preferably $1.0 \times 10^{-1}$ to $3.0 \times 10^{-1}$ Pa)

Electric powder applied: 30 to 1,000 W, preferably 50 to 750 W, more preferably 80 to 500 W Deposition rate: 1.0 to 60 nm/sec, preferably 1.0 to 45 nm/sec, more preferably 1.0 to 30 nm/sec A substrate with an EUV reflective layer is obtained is by the procedure so far. To produce an EUV mask blank using the obtained substrate with an EUV reflective layer, an absorber layer is formed on the protective layer formed by the above procedure by a known deposition method, specifically by sputtering method such as magnetron sputtering or ion beam sputtering.

The property that is particularly required for the absorber layer is a very low EUV light reflectance. Specifically, when the absorber layer is irradiated with a ray in the wavelength range of the EUV light, the maximum reflectance to light having a wavelength in the vicinity of 13.5 nm is preferably at most 0.5%, more preferably at most 0.1%.

A material constituting the absorber layer is a material having a high absorption coefficient to EUV light, specifically, Cr, Ta, a nitride thereof, or the like. Particularly, TaN is preferred, since an amorphous absorber layer having smooth surface is likely to be obtained. The thickness of the absorber layer is preferably from 50 to 100 nm. A method of depositing an absorber layer is not particularly limited so long as it is a sputtering method, and either magnetron sputtering or ion beam sputtering may be employed.

In a case where a TaN layer is deposited as the absorber layer by ion beam sputtering, it is preferred to deposit a film so as to have a thickness of from 50 to 100 nm, using a Ta target as the target and a $N_2$ gas (gas pressure: $1.3 \times 10^{-2}$ Pa to $2.7 \times 10^{-2}$ Pa) as the sputtering gas with a voltage of from 300 to 1,500 V at a deposition rate of from 0.01 to 0.1 nm/sec.

In deposition of the reflective multilayer film, the protective layer and the absorber layer, in order to obtain a uniform film, deposition is carried out preferably by rotating a substrate by using a rotor.

In production of an EUV mask blank, a functional film known in the field of the EUV mask blank may be formed in addition to the reflective layer, the protective layer and the absorber layer. Specific examples of such a functional film include a highly dielectric coating to be applied on the back side of the substrate to accelerate electrostatic chucking of the substrate as disclosed in JP-A-2003-501823. The back side of the substrate represents a face opposite to the face on which the reflective layer is formed in the substrate on which films are deposited. The electrical conductivity of a constituent material and the thickness of the highly dielectric coating to be applied on the back side of the substrate for the above purpose are selected so that the sheet resistance will be at most 100Ω/□. As the constituent material of the highly dielectric coating can be widely selected from ones disclosed in known literature. For example, a highly dielectric coating as disclosed in JP-A-2003-501823, specifically, a coating comprising Si, TiN, Mo, Cr or TaSi can be applied. The thickness of the highly dielectric coating may, for example, be from 10 to 1,000 nm.

The highly dielectric coating can be formed by a known deposition method, e.g. a sputtering method such as magnetron sputtering or ion beam sputtering, a CVD method, a vacuum deposition method or an electrolytic plating method.

Now, the present invention will be described in further detail with reference to Examples. However, it should be understood that the present invention is by no means restricted to such specific Examples.

EXAMPLE 1

In this Example, a substrate with an EUV reflective layer was prepared in the following procedure.

As a substrate for deposition, a $SiO_2$—$TiO_2$ glass substrate (outer dimensions of 6 inch (152.4 mm) square and a thickness of 6.3 mm) was used. This glass substrate has a coefficient of thermal expansion of $0.2 \times 10^{-7}/°C.$, a Young's modulus of 67 GPa, a Poisson's ratio of 0.17 and a specific rigidity of $3.07 \times 10^7$ $m^2/s^2$. The glass substrate was polished so as to have a smooth surface with rms of at most 0.15 nm and a flatness of at most 100 nm.

On the back side of the substrate, a highly dielectric coating with a sheet resistance of $100\Omega/\square$ was applied by depositing a Cr film with a thickness of 100 nm by magnetron sputtering.

Then, the substrate was placed in a deposition chamber and a Si/Mo reflective multilayer film as a reflective layer was formed. Specifically, the substrate (outer dimensions of 6 inch (152.4 mm) square and a thickness of 6.3 mm) was fixed to a conventional electrostatic chuck in a flat plate shape using the formed Cr film, and a cycle comprising alternately depositing a Si film and a Mo film on the surface of the substrate by ion beam sputtering was repeated 40 times to form a Si/Mo reflective multilayer film having a total film thickness of 272 nm ((4.5 nm+2.3 nm)×40).

The deposition conditions for the Si films and the Mo films are as follows.

(Deposition Conditions for Si Films)
  Target: Si target (doped with boron)
  Sputtering gas: Ar gas (gas pressure 0.02 Pa)
  Voltage: 700 V
  Deposition rate: 0.077 nm/sec
  Film thickness: 4.5 nm (Deposition Conditions for Mo Films)
  Target: Mo target
  Sputtering gas: Ar gas (gas pressure: 0.02 Pa)
  Voltage: 700 V
  Deposition rate: 0.064 nm/sec
  Film thickness: 2.3 nm Then, in the deposition chamber in which the Si/Mo reflective multilayer film was formed, a Ru layer as a protective layer was formed on the Si/Mo reflective multilayer film by using the above sputtering target (A) to obtain a substrate with an EUV reflective layer. The sputtering target (A) was prepared by blending Ru and B into a desired compositional ratio (Ru: 50 at %, B: 50 at %), pressure forming the mixture and sintering it in the air atmosphere at a high temperature (1,400° C.) under atmospheric pressure.

The deposition conditions for the protective layer are as follows.
  Sputtering gas: Ar gas (gas pressure: 0.02 Pa)
  Voltage: 700 V
  Deposition rate: 0.064 nm/sec
  Film thickness: 2.5 nm The following evaluations were carried out with respect to the obtained substrate with an EUV reflective layer.

(Composition of Protective Layer)
The composition of the protective layer was measured by using an X-ray photoelectron spectrometer (manufactured by PERKIN ELEMER-PHI, No. 5500). The compositional ratio (at %) of the protective layer was Ru:B=74:26)

(Evaluation of Number of Particles)
The number of particles on the obtained substrate with an EUV reflective layer was counted by a laser defect inspection apparatus (M1350 manufactured by Lasertec Corporation) and as a result, the number of particles was 0.5 particle/$cm^2$. Further, the above procedure was repeated for 150 cycles, but no increase in the defects was observed.

(Reflection Properties (EUV Reflectance))
The protective layer was irradiated with EUV light (synchrotron radiation) at an angle of incidence $\theta$ (6°) to measure the reflectance. As a result, the EUV reflectance on the surface of the protective layer was 64%.

(Film Stress of Protective Layer)
The film stress of the Ru layer as the protective layer was measured as follows.

A Ru layer with a film thickness of 100 nm was deposited on a Si substrate in the same manner as in the above formation of the protective layer by using the sputtering target (A), and the film stress of the Ru layer was measured by using PROFILE PROJECTOR V12 (manufactured by Nikon Corporation). The film stress of the Ru layer was 315 MPa (compressive stress).

(Surface Roughness)
The surface roughness of the protective layer was confirmed by using an atomic force microscope (manufactured by Seiko Instruments Incorporated, No. SPI3800) in accordance with JIS B0601 (1994). The surface roughness of the protective layer was 0.20 nm rms.

(Etching Properties)
The etching properties were evaluated by the following method.

A Ru layer with a film thickness of about 100 nm was deposited on a Si chip (10 mm×30 mm) in the same manner as in the above formation of the protective layer by using the sputtering target (A) to prepare a sample for evaluation of etching properties.

This sample was placed on a sample support (4 inch quartz substrate) of a RF plasma etching apparatus. In such a state, plasma etching (RF plasma etching) was carried out on the Ru layer on the Si chip placed on the sample support under the following conditions.
  Bias RF: 50 W
  Etching time: 120 sec
  Trigger pressure: 3 Pa
  Etching pressure: 1 Pa
  Etching gas: $Cl_2/Ar$
  Gas flow rate ($Cl_2/Ar$):20/80 sccm
  Distance between electrode substrates: 55 mm The obtained etching rate was 1.27 nm/min which is equal to or lower than the etching rate (about 1.48 nm/min) of a conventional Ru protective layer, and the protective layer had sufficient etching resistance.

EXAMPLE 2

A substrate with an EUV reflective layer is formed in the same manner as in Example 1 except that a sputtering target (A) (composition: Ru 70 at %, B 30 at %) differing in the B content is used for formation of the protective layer.

With respect to the obtained substrate with an EUV reflective layer, the composition of the protective layer is analyzed. The compositional ratio (at %) of the protective layer is Ru:B=86:14.

With respect to the substrate with an EUV reflective layer, the number of particles is measured. It is confirmed that the number of particles is 0.5 particle/cm$^2$. Even after the above procedure is repeated for 150 cycles, no increase in defects is observed.

The film stress of the Ru layer as the protective layer is measured in the same manner as in Example 1. The film stress of the Ru layer is 312 MPa (compressive stress).

The surface roughness of the Ru layer as the protective layer is measured in the same manner as in Example 1. The surface roughness of the Ru layer is 0.12 nm rms.

The etching properties of the Ru layer as the protective layer are evaluated in the same manner as in Example 1. The etching rate of the Ru layer is 1.50 nm/min.

EXAMPLE 3

A substrate with an EUV reflective layer is formed in the same manner as in Example 1 except that the above sputtering target (B) (composition: Ru 50 at %, Zr 50 at %) is used for formation of the protective layer.

With respect to the obtained substrate with an EUV reflective layer, the composition of the protective layer is analyzed. The compositional ratio (at %) of the protective layer is Ru:Zr=72:28.

With respect to the substrate with an EUV reflective layer, the number of particles is measured. It is confirmed that the number of particles is 0.5 particle/cm$^2$. Even after the above procedure is repeated for 150 cycles, no increase in defects is observed.

The film stress of the Ru layer as the protective layer is measured in the same manner as in Example 1. The film stress of the Ru layer is 322 MPa (compressive stress).

The surface roughness of the Ru layer as the protective layer is measured in the same manner as in Example 1. The surface roughness of the Ru layer is 0.15 nm rms.

The etching properties of the Ru layer as the protective layer are evaluated in the same manner as in Example 1. The etching rate of the Ru layer is 1.58 nm/min.

EXAMPLE 4

A substrate with an EUV reflective layer is formed in the same manner as in Example 1 except that a sputtering target (B) (composition: Ru 70 at %, Zr 30 at %) differing is in the B content from Example 3 is used for formation of the protective layer.

With respect to the obtained substrate with an EUV reflective layer, the composition of the protective layer is analyzed. The compositional ratio (at %) of the protective layer is Ru:Zr=85:15.

With respect to the substrate with an EUV reflective layer, the number of particles is measured. It is confirmed that the number of particles is 0.5 particle/cm$^2$. Even after the above procedure is repeated for 150 cycles, no increase in defects is observed.

The film stress of the Ru layer as the protective layer is measured in the same manner as in Example 1. The film stress of the Ru layer is 330 MPa (compressive stress).

The surface roughness of the Ru layer as the protective layer is measured in the same manner as in Example 1. The surface roughness of the Ru layer is 0.14 nm rms.

The etching properties of the Ru layer as the protective layer are evaluated in the same manner as in Example 1. The etching rate of the Ru layer is 1.45 nm/min.

COMPARATIVE EXAMPLE

A substrate with an EUV reflective layer was obtained in the same manner as in Example 1 except that a sputtering target consisting of only Ru was used for formation of the protective layer.

With respect to the obtained substrate with an EUV reflective layer, the composition of the protective layer was analyzed to confirm that the protective layer consisted of only Ru.

With respect to the obtained substrate with an EUV reflective layer, the number of particles on the surface of the protective layer was measured and as a result, it was 0.6 particle/cm$^2$. However, after the above procedure was repeated for 100 cycles, the number of particles increased to 100 particles/cm$^2$. The increase in the particles is considered to be caused by film peeling from a deposited film attached to the inner wall of the deposition chamber and structures in the chamber.

The film stress of the Ru layer as the protective layer was measured in the same manner as in Example 1. The film stress of the Ru layer was 2,109 MPa (compressive stress).

The entire disclosure of Japanese Patent Application No. 2006-284720 filed on Oct. 19, 2006 including specification, claims and summary is incorporated herein by reference in its entirety.

What is claimed is:

1. A sputtering target for forming a ruthenium (Ru) layer in a reflective layer for reflecting EUV light on a substrate, which contains Ru and at least one element selected from the group consisting of boron (B) and zirconium (Zr) in a total content of B and Zr of from 5 at % to 50 at %.

2. A process for producing a substrate with a reflective layer for EUV lithography, which comprises a step of forming a ruthenium (Ru) layer in a reflective layer for reflecting EUV light on a substrate, by sputtering using the sputtering target as defined in claim 1.

3. A substrate with a reflective layer for EUV lithography, produced by the process as defined in claim 2.

4. A process for producing a substrate with a reflective layer for EUV lithography, which comprises a step of forming, on a reflective layer for reflecting EUV light, a ruthenium (Ru) layer as a protective layer for the reflective layer, by sputtering using the sputtering target as defined in claim 1.

5. A substrate with a reflective layer for EUV lithography, produced by the process as defined in claim 4.

6. A process for producing a reflective mask blank for EUV lithography, which comprises a step of forming a ruthenium (Ru) layer in a reflective layer for reflecting EUV light on a substrate, by sputtering using the sputtering target as defined in claim 1.

7. A reflective mask blank for EUV lithography, produced by the process as defined in claim 6.

8. A process for producing a reflective mask blank for EUV lithography, which comprises a step of forming, on a reflective layer for reflecting EUV light, a ruthenium (Ru) layer as a protective layer for the reflective layer, by sputtering using the sputtering target as defined in claim 1.

9. A reflective mask blank for EUV lithography, produced by the process as defined in claim 8.

* * * * *